United States Patent
Tan (10) Patent No.: US 9,780,081 B2
(45) Date of Patent: Oct. 3, 2017

(54) CHIP PACKAGE STRUCTURE AND MANUFACTURING METHOD THEREFOR

(71) Applicant: Silergy Semiconductor Technology (Hangzhou) LTD, Hangzhou, ZheJiang Province (CN)

(72) Inventor: Xiaochun Tan, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/051,432

(22) Filed: Feb. 23, 2016

(65) Prior Publication Data

US 2016/0284638 A1    Sep. 29, 2016

(30) Foreign Application Priority Data

Mar. 27, 2015 (CN) .......................... 2015 1 0137676

(51) Int. Cl.
*H01L 23/00* (2006.01)
*H01L 25/00* (2006.01)
(Continued)

(52) U.S. Cl.
CPC .......... *H01L 25/50* (2013.01); *H01L 23/3107* (2013.01); *H01L 23/3135* (2013.01); *H01L 23/49537* (2013.01); *H01L 24/11* (2013.01); *H01L 24/16* (2013.01); *H01L 24/48* (2013.01); *H01L 24/81* (2013.01); *H01L 24/82* (2013.01); *H01L 25/0655* (2013.01);
(Continued)

(58) Field of Classification Search
CPC .......... H01L 23/49861; H01L 23/3114; H01L 23/49541; H01L 24/16; H01L 24/48; H01L 23/49575; H01L 25/0655; H01L 21/565; H01L 21/4825; H01L 21/4846; H01L 21/2885; H01L 24/11; H01L 24/81; H01L 25/50; H01L 2924/181; H01L 23/3107
See application file for complete search history.

(56) References Cited

U.S. PATENT DOCUMENTS 6,013,948 A * 1/2000 Akram ................... H01L 23/13
257/680
7,633,765 B1 * 12/2009 Scanlan .............. H01L 21/4857
174/262
(Continued)

FOREIGN PATENT DOCUMENTS

CN          101241904 A      8/2008
CN          101615609 A      12/2009

*Primary Examiner* — Roy Potter
(74) *Attorney, Agent, or Firm* — Michael C. Stephens, Jr.

(57) ABSTRACT

A chip package structure can include: a lead frame having a carrier substrate and a first lead around the carrier substrate; a first conductive post arranged on the first lead and electrically coupled with the first lead; a first chip having an active face and an inactive face opposite to the active face and attached to the carrier substrate, and electrode pads on the active face are provided with a first electrical connector; a first plastic package configured to fully encapsulate the first chip, and to partly encapsulate the lead frame, where the first plastic package includes a first surface and a second surface opposite to the first surface, where the first conductive post and the first electrical connector are exposed on the first surface, and where the first lead is exposed on the second surface, and a second lead being arranged on the first surface.

20 Claims, 8 Drawing Sheets

(51) Int. Cl.
*H01L 25/065* (2006.01)
*H01L 23/31* (2006.01)
*H01L 23/495* (2006.01)
*H01L 23/538* (2006.01)

(52) U.S. Cl.
CPC .... *H01L 23/49575* (2013.01); *H01L 23/5389* (2013.01); *H01L 2224/16225* (2013.01); *H01L 2224/16245* (2013.01); *H01L 2224/24* (2013.01); *H01L 2224/48245* (2013.01); *H01L 2224/81191* (2013.01); *H01L 2224/81801* (2013.01); *H01L 2924/00014* (2013.01)

(56) References Cited

U.S. PATENT DOCUMENTS

| | | |
|---|---|---|
| 2003/0102489 A1 | 6/2003 | Nam |
| 2004/0262774 A1 | 12/2004 | Kang et al. |
| 2005/0275061 A1 | 12/2005 | Ohguro |
| 2009/0039869 A1 | 2/2009 | Williams |
| 2011/0134613 A1 | 6/2011 | Moussaoui |
| 2011/0298528 A1 | 12/2011 | Endo |
| 2012/0322202 A1 | 12/2012 | Nishimura |
| 2013/0299957 A1 | 11/2013 | Kobayashi et al. |

* cited by examiner

CHIP PACKAGE STRUCTURE AND MANUFACTURING METHOD THEREFOR

RELATED APPLICATIONS

This application claims the benefit of Chinese Patent Application No. 201510137676.X, filed on Mar. 27, 2015, which is incorporated herein by reference in its entirety.

FIELD OF THE INVENTION

The present disclosure generally relates to the field of chip packaging, and more particularly to chip package assemblies and associated manufacturing methods.

BACKGROUND

In a traditional front-mounted chip package assembly, the inactive face of a chip can be attached to a chip carrier substrate of a lead frame, while electrodes on the active face of the chip are can connect to leads that lie around the carrier substrate via metal wires. In this way, the electrodes on the active face of the chip can be coupled to external circuitry. However, this approach may result in a relatively large package resistance because relatively slender metal wires are used to lead out the electrodes on the chip surface. Also, the reliability of the chip package may be adversely affected due to pseudo soldering between the metal wires and chip pads. Further, as electronic devices become thinner and thinner, traditional lead bonding approaches may not satisfy thickness requirements.

SUMMARY

In one embodiment, a chip package structure can include: (i) a lead frame having a carrier substrate and a first lead around the carrier substrate; (ii) a first conductive post arranged on the first lead and electrically coupled with the first lead; (iii) a first chip having an active face and an inactive face opposite to the active face, where the inactive face is attached to the carrier substrate, and electrode pads on the active face are provided with a first electrical connector; (iv) a first plastic package configured to fully encapsulate the first chip, and to partly encapsulate the lead frame, where the first plastic package includes a first surface and a second surface opposite to the first surface, where the first conductive post and the first electrical connector are exposed on the first surface, and where the first lead is exposed on the second surface, and (v) a second lead being arranged on the first surface, where the second lead is configured to electrically couple the first electrical connector with the first conductive post.

In one embodiment, a method of making a chip package structure can include: (i) providing a lead frame having a carrier substrate and a first lead, and forming a first conductive post that is electrically coupled with the first lead on the first lead, where the first lead is around the carrier substrate; (ii) attaching an inactive surface of a first chip to the carrier substrate, and providing a first electrical connector on the electrode pads of an active face that is opposite to the inactive face of the first chip; (iii) performing a first plastic process to form a first plastic package that fully encapsulates the first chip and partly encapsulates the lead frame, exposing the first conductive post and the first electrical connector on a first surface of the first plastic package, and exposing the first lead on a second surface that is opposite to the first surface; and (iv) forming a second lead that is configured to electrically couple the first conductive post to the first electrical connector on the first surface.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In one embodiment, a chip package structure can include: (i) a lead frame having a carrier substrate and a first lead around the carrier substrate; (ii) a first conductive post arranged on the first lead and electrically coupled with the first lead; (iii) a first chip having an active face and an inactive face opposite to the active face, where the inactive face is attached to the carrier substrate, and electrode pads on the active face are provided with a first electrical connector; (iv) a first plastic package configured to fully encapsulate the first chip, and to partly encapsulate the lead frame, where the first plastic package includes a first surface and a second surface opposite to the first surface, where the first conductive post and the first electrical connector are exposed on the first surface, and where the first lead is exposed on the second surface, and (v) a second lead being arranged on the first surface, where the second lead is configured to electrically couple the first electrical connector with the first conductive post.

Figure 1:
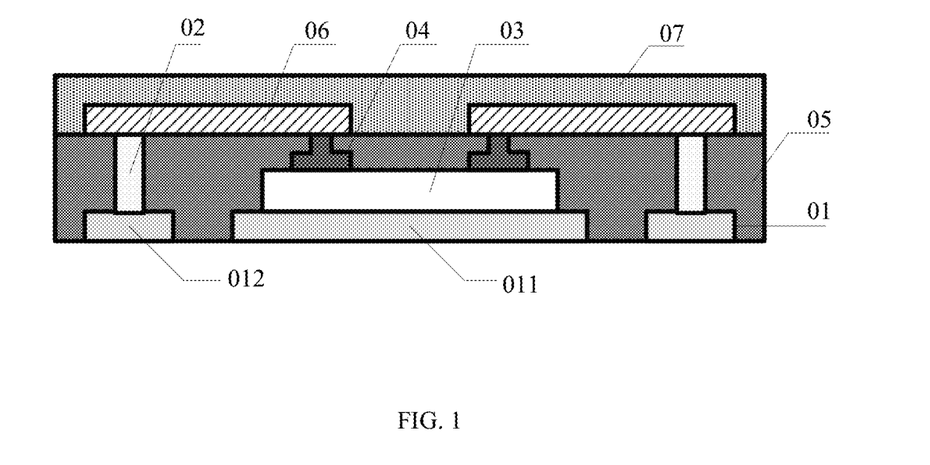
FIG. 1 is a sectional view of a first example chip package structure, in accordance with embodiments of the present invention.

Referring now to FIG. 1, shown is a sectional view of a first example chip package structure, in accordance with embodiments of the present invention. In this particular example, the chip package structure can include lead frame 01, conductive post 02, chip 03, electrical connector 04, plastic package 05, lead 06, and plastic package 07. Lead frame 01 can include carrier substrate 011 and lead 012 around the carrier substrate. For example, the number of leads 012 can be one, or more than one, and which may be set according to the number of electrodes and circuits on the active face of chip 03. Lead frame 01 can be made of any suitable conductive material (e.g., copper). Also, the leads and the carrier substrate may both be conductive in some cases. When forming the lead frame, if there is no electrode on the surface of the chip contacted with the carrier substrate, the carrier substrate may not be conductive, and in this case only leads may be made of a conductive material.

Conductive post 02 can electrically connect to lead 012, and conductive post 02 may be made of the same material (e.g., copper) as that of lead 012. The height of conductive post 02 can be determined to ensure that the superimposing height of conductive post 02 and lead 012 substantially equals the superimposing height of chip 03, electrical connector 04, and carrier substrate 011. Chip 03 may have an active face and an inactive face that is opposite to the active face, where the inactive face is attached to carrier substrate 011. When there are electrode pads provided on the inactive surface, such may also be referred as a surface electrode pad. If the inactive face of chip 03 is provided with electrode pads, the electrode pads can be attached to carrier substrate 011 via solder or conductive glue, and may further lead out through carrier substrate 011.

In some applications, if the electrodes lead out by carrier substrate 011 are to be electrically connected to the electrodes lead out by lead 012, carrier substrate 011 can be electrically connected to lead 012. For example, carrier substrate 011 can connect to lead 012, or carrier substrate 011 may have an extension portion as lead 012 to be electrically coupled with the electrodes on the active face of chip 03. Electrical connector 04 may be provided on the electrode pad that is on the active face of chip 03, and can be made of the same material (e.g., copper) as that of conductive post 02. Electrical connector 04 can be configured to electrically couple the electrode pads on the active face of chip 03 to an outer assembly (e.g., a lead).

Plastic package 05 can fully encapsulate chip 03, and partly encapsulate lead frame 01, in order to protect the active components in chip 03 from being damaged by vapor or other contaminants. In some cases, lead frame 01, conductive post 02 and electrical connector 4 can be partly encapsulated, while conductive post 02 and electrical connector 04 may be exposed on the first surface of plastic package 05 and be electrically connected to other assemblies (e.g., leads). Also, lead 012 may be exposed on a second surface of plastic package 05, and can be electrically connected to other assemblies. The first surface of plastic package 05 can be the surface opposite to the second surface. If carrier substrate 011 is not electrically connected to the electrode pads of chip 03, it may not be exposed at the second surface. Otherwise, carrier substrate 011 can be exposed on the second surface when electrically coupling to the electrode pads, in order to electrically couple with other assemblies.

Lead 06 can be arranged on the first surface of plastic package 05, and maybe configured to electrically couple conductive post 02 to electrical connector 04. The number of lead 06 can be one or more than one, which may be determined according to the number of leads 012. Also, lead 06 can be made of the same material (e.g., copper) as that of conductive post 02 and electrical connector 04. Each of leads 06 can be configured to electrically couple electrical connector 04 to conductive post 02.

This example chip package structure can also include plastic package 07, which may be arranged on the first surface of plastic package 05 to fully encapsulate lead 06. Plastic package 05 can be made of the same material (e.g., epoxy resin molding compound, epoxy molding compound, etc.) as plastic package 07. In certain embodiments, the electrode pads on the active face of the chip can be lead out through a conducting path formed by electrical connectors, conductive posts, and leads, such that the leads can electrically couple the chip to an external circuitry.

In this way, the proportion between the area of lead 06 and conductive post 02 that is perpendicular to the current direction and the length of the conducting path may be much greater than the proportion between the section area of the lead bonding and the length of the conducting path. Thus, the approach of leading out the electrodes in certain embodiments may effectively reduce the packaging resistance relative to traditional lead bonding approaches. Also, chip package reliability can be improved by avoiding pseudo soldering phenomenon by not using any such solder. Also, the chip package size may be relatively close to the actual size of a die since the thickness of lead 06 may be much thinner, as compared to other approaches.

Figure 2:
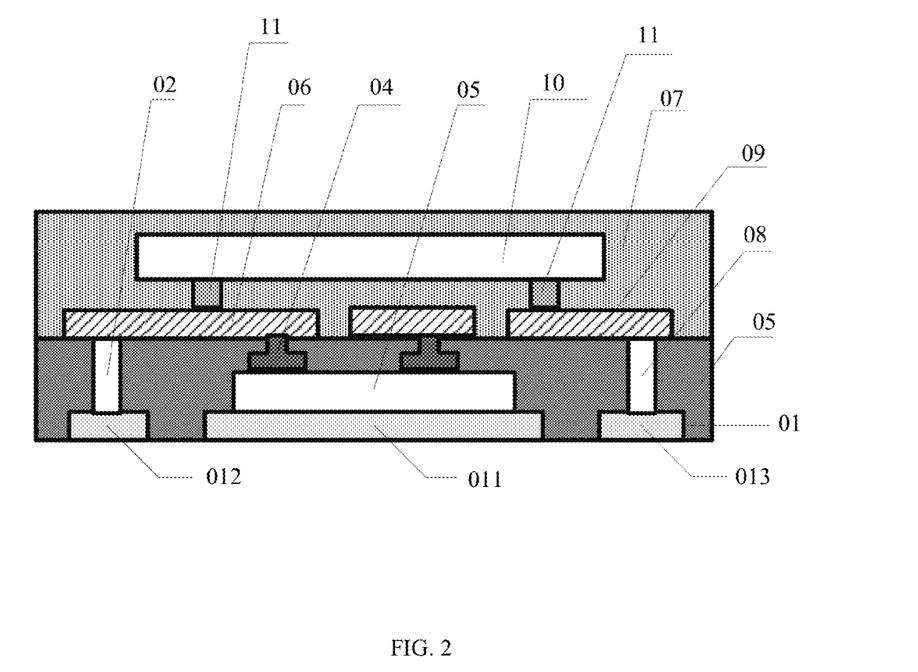
FIG. 2 is a sectional view of a second example chip package structure, in accordance with embodiments of the present invention.

Referring now to FIG. 2, shown is a sectional view of a second example chip package structure, in accordance with embodiments of the present invention. In this particular example, lead frame 01 can also include lead 013 around carrier substrate 011, which can be made of the same material as lead 012. The chip package structure can also include conductive post 08, lead 09, chip 10, and electrical connector 11.

Conductive post 08 may be formed on lead 013, and can electrically connect to lead 013, and can be made of the same material (e.g., copper) as lead 013. Similarly, the height of conductive post 08 may be the same as the height of conductive post 02, and conductive post 08 can be arranged in plastic package 05 and exposed on the first surface of plastic package 05. Lead 09 can be arranged on the first surface of plastic package 05 and may be electrically coupled with conductive post 08. Also, lead 09 and lead 013 can be made of the same material (e.g., copper). Further, the number of leads 09 can be one or more than one, which may be determined according to the number of the electrodes or circuits on the active face of chip 10.

The active face of chip 10 can be towards the first surface of plastic package 05, and the electrode pads on the active face can electrically connect lead 09 through electrical connector 11. The electrode pads on the active face of chip 10 can electrically connect lead 06 through electrical connector 11, and electrical connector 11 may be a conductive bump or solder. In other examples, the active face of chip 10 can face away from the first surface of plastic package 05, whereby the inactive face of chip 10 is arranged on the first surface. The electrode pads on the active face of chip 10 can electrically connect lead 09 or lead 06 through electrical connector 11. The electrode pads on the active face of chip 10 electrically can connect lead 09 and/or lead 06 through electrical connector 11, and may include a metal wire. Also, lead 09 and chip 10 can be encapsulated by plastic package 07.

In this particular example, the electrodes on the second chip can be lead out via a path formed by a second electrical connector, a fourth lead and a third lead. The third lead can be configured to couple the second chip with external circuitry. Also, the electrodes on the second chip can be electrically connected to the electrodes on the first chip via a conducting path formed by the second electrical connector, the second lead, the first electrical connector, and can be further lead out through a conducting path formed by the first electrical connector, the second lead, the first conductive post and the first lead, so as to electrically couple to external circuitry via the first lead. Thus, a chip package structure of certain embodiments can provide a stacked package for a plurality of chips, and because the current processing ability of the conducting path is relatively strong, the reliability of the chip package can be effectively improved without using any lead bonding, so as to reduce package resistance and thickness.

In one embodiment, a method of making a chip package structure can include: (i) providing a lead frame having a carrier substrate and a first lead, and forming a first conductive post that is electrically coupled with the first lead on the first lead, where the first lead is around the carrier substrate; (ii) attaching an inactive surface of a first chip to the carrier substrate, and providing a first electrical connector on the electrode pads of an active face that is opposite to the inactive face of the first chip; (iii) performing a first plastic process to form a first plastic package that fully encapsulates the first chip and partly encapsulates the lead frame, exposing the first conductive post and the first electrical connector on a first surface of the first plastic package, and exposing the first lead on a second surface that is opposite to the first surface; and (iv) forming a second lead that is configured to electrically couple the first conductive post to the first electrical connector on the first surface.

Figure 3A:
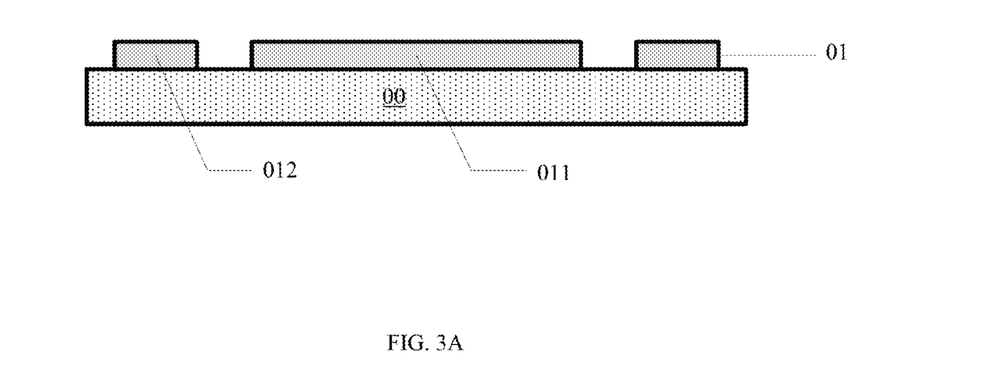
FIGS. 3A to 3F are cross-sectional views of an example chip package structure during various manufacturing steps, in accordance with embodiments of the present invention.

Referring now to FIGS. 3A to 3F, shown are cross-sectional views of an example chip package structure during various manufacturing steps, in accordance with embodiments of the present invention. In FIG. 3A, lead frame 01 having carrier substrate 011 and lead 012 on package substrate 00 can be formed, where lead 012 is around the carrier substrate 011. For example, forming lead frame 01 can include forming a first conductive layer (e.g., a copper layer) on package substrate 00, and forming a patterned first conductive layer by using a mask to conduct an etching process such that the first conductive layer may form lead frame 10 having a centered carrier substrate and lead 012 around the carrier substrate. Also, when forming lead frame 01, carrier substrate 011 may have an extension portion as lead 012. Thus, carrier substrate 011 can electrically connect to lead 012, and carrier substrate 011 and lead 012 may be integrally formed when manufacturing lead frame 01.

Figure 3B:
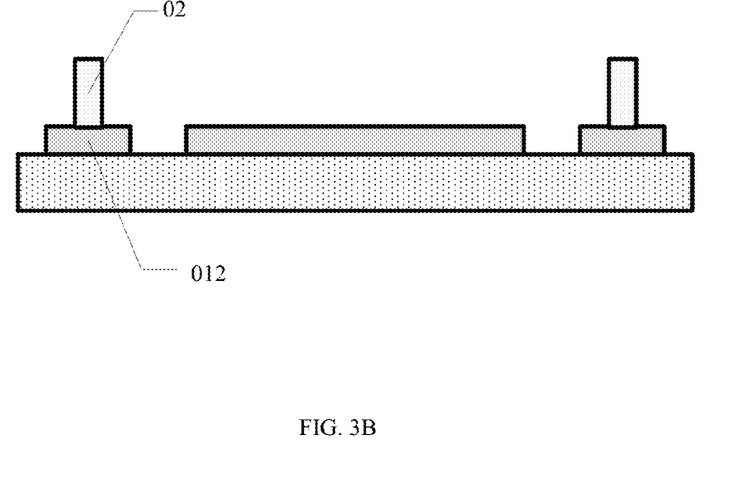

In FIG. 3B, conductive post 02 on lead 012 can be formed. Conductive post 02 can electrically connect to lead 012, and the height of conductive post 02 may be determined according to the thickness of the chip to be packaged. For example, conductive post 02 can be formed on lead 012 by electroplating, and the electroplating material may be the same material (e.g., copper) as that of lead 012.

Figure 3C:
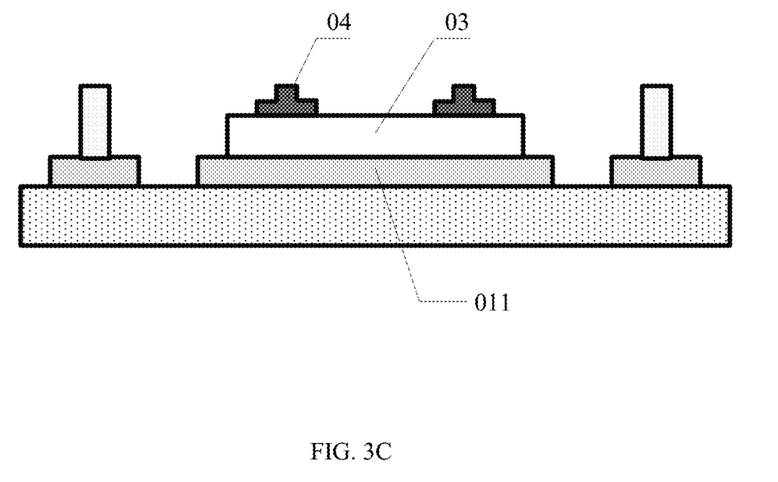

In FIG. 3C, the inactive face of chip 03 can be attached to carrier substrate 011. The inactive face can be opposite to the active face of chip 03. Electrical connector 04 can be provided on the electrode pads of the active face of chip 03. For example, electrical connector 04 can be a metal layer or a conductive bump formed on the electrode pads of the active face of chip 03. If the inactive face is provided with electrodes, the electrodes can be attached to carrier substrate 011 through solder or conductive glue, so as to electrically couple to carrier substrate 011. If the extension portion of carrier substrate 011 is configured as lead 012, the electrodes lead out by lead 012 can electrically connect to the electrodes lead out by carrier substrate 011.

Figure 3D:
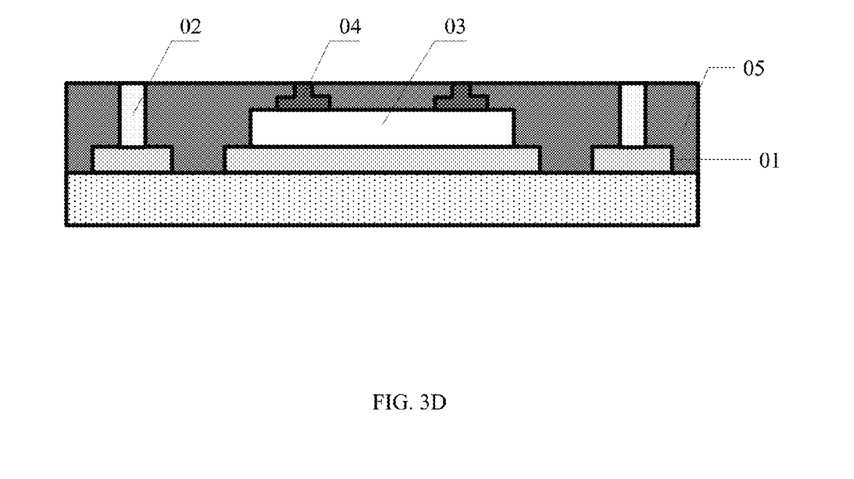

In FIG. 3D, a first packaging process can occur with a molding compound such that the molding compound covers the packaging substrate in order to fully encapsulate chip 03 and partly encapsulate lead frame 01. This can form plastic package 05 having a first surface and a second surface opposite to the first surface, where conductive post 92 and electrical connector 04 are both exposed on the first surface. In order to obtain such a plastic package 05, the molding compound may cover conductive post 02 and electrical connector 04 after completing the first packaging process. Therefore, the first surface of plastic package 05 can be polished until conductive post 02 and electrical connector 04 are exposed on the first surface.

Figure 3E:
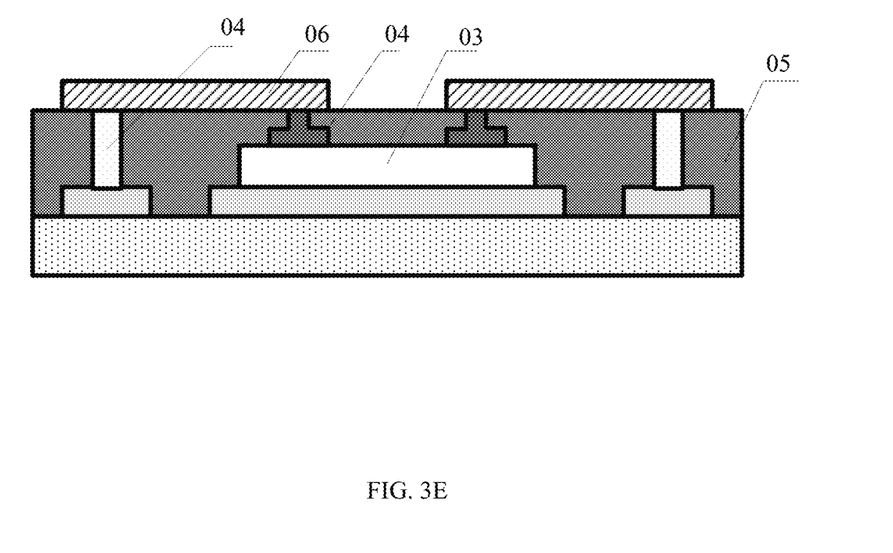

In FIG. 3E, lead 06 can be formed on the first surface of plastic package 05 to electrically couple conductive post 02 with electrical connector 04. Forming lead 06 may include: forming a second conductive layer on the first surface, and patterning the second conductive layer to form lead 06. The number of leads 06 can be one or more than one, and which may be determined according to the number of the electrodes or circuits on the active face of chip 03. Each of leads 06 can be configured to electrically couple conductive post 02 to electrical connector 04.

Figure 3F:
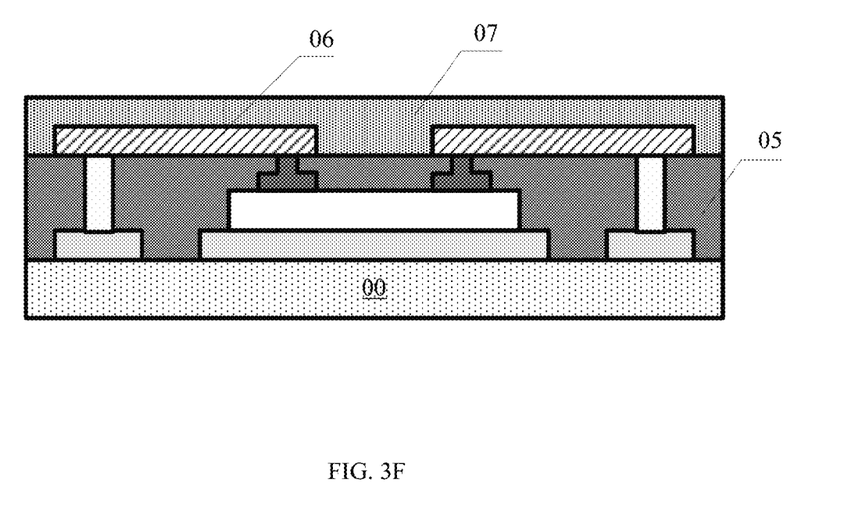

In FIG. 3F, a second packaging process can occur with the molding compound on the first surface such that the molding compound may cover lead 06 to form plastic package 07. Packaging substrate 00 can be removed after forming plastic package 07, in order to expose lead 012 and carrier substrate 011 on the second surface of plastic package 05, so as to obtain the example chip package structure shown in FIG. 1, where the second surface is opposite to the first surface.

As described above, the electrode pads on the active face of the chip can be lead out through a conducting path formed by a first electrical connector, a second lead, a first conductive post and a first lead, such that the first lead can electrically couple the chip to an external circuit. In this way, the proportion between the area of section the second lead and first conductive post that is perpendicular to the current direction and the length of the conducting path can be much greater than the proportion between the section area of the lead bonding and the length of the conducting path. Thus, leading out the electrodes in particular embodiments may effectively reduce the packaging resistance relative to traditional approaches of lead bonding, and the reliability of the chip package can be improved by avoiding pseudo soldering phenomenon without using any solder. Also, the chip package size may be relatively close to the actual size of a die since the thickness of the second lead can be much thinner than in other approaches.

When forming lead frame 01 on the packaging substrate, lead frame 01 can also include lead 013 around carrier substrate 011. Conductive post 08 can be formed on lead 013 before attaching the inactive face of chip 03 to carrier substrate 011, and conductive post 08 can be exposed on the first surface when forming plastic package 05. Conductive post 08 may be formed by the same way as conductive post 02 formed on lead 012, and both of conductive posts 02 and 08 may be formed in one process. Lead 09 can be formed to electrically couple with conductive post 08 on the first surface after forming plastic package 05, where leads 06 and 09 are formed in the same process.

The active face of chip 10 can be oriented towards the first surface of plastic package 05, and the electrode pads on the active face can electrically connect to lead 09 through electrical connector 11. Thus, the electrodes on chip 10 may be lead out by lead 08 electrically connected to lead 09, so as to electrically couple with external circuitry. For example, electrical connector 11 can be a conductive bump or a solder ball. Also, in other examples, the active face of chip 10 can be oriented towards the first surface of plastic package 05, where the active face of chip 10 is arranged on the first surface of plastic package 05. In this case, the electrode pads on the active face can electrically connect to lead 06 and/or lead 09 via electrical connector 11. For example, the inactive face of chip 10 can be opposite to the active face, and electrical connector 11 can be a metal wire.

In addition, the electrode pads on the active face of chip 10 can electrically connect to lead 06 via electrical connector 11. Thus, chip 10 can electrically connect chip 03 and the common node of such chips can be lead out to external circuitry. Plastic package 07 may cover lead 09 and chip 10 when forming plastic package 07. Also, lead 08 may be exposed on the second surface in order to electrically couple lead 08 to external circuitry when forming plastic package 05.

In certain embodiments, the electrodes on a second chip can be lead out via a path formed by a second electrical connector, a fourth lead and a third lead. The third lead can be configured to couple the second chip with external circuitry. Also, the electrodes on the second chip can electrically connect the electrodes on the first chip via the conducting path formed by the second electrical connector, the second lead, the first electrical connector, and can be further lead out through a conducting path formed by the first electrical connector, the second lead, the first conductive post and the first lead, so as to electrically couple to the external circuit via the first lead. Thus, in the example chip package structure, since the current processing ability of the conducting path is relatively strong, the reliability of the chip package can be effectively improved without using any lead bonding, which can reduce package resistance and thickness.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A chip package structure, comprising:
   a) a lead frame having a carrier substrate and a first lead around said carrier substrate;
   b) a first conductive post arranged on said first lead and electrically coupled with said first lead;
   c) a first chip having an active face and an inactive face opposite to said active face, wherein said inactive face is attached to said carrier substrate, and electrode pads on said active face are provided with a first electrical connector;
   d) a first plastic package configured to fully encapsulate said first chip, and to partly encapsulate said lead frame, wherein said first plastic package comprises a first surface and a second surface opposite to said first surface, wherein said first conductive post and said first electrical connector are exposed on said first surface, and wherein said first lead is exposed on said second surface, and
   e) a second lead being arranged on said first surface, wherein said second lead is configured to electrically couple said first electrical connector with said first conductive post.

2. The chip package structure of claim 1, further comprising a fully encapsulated second plastic package of said second lead.

3. The chip package structure of claim 2, wherein said carrier substrate is exposed on second surface.

4. The chip package structure of claim 3, wherein said inactive surface is provided with electrode pads, and wherein said electrode pads are attached to said carrier substrate via solder or conductive glue.

5. The chip package structure of claim 4, wherein said carrier substrate is electrically coupled to one of said first leads.

6. The chip package structure of claim 3, wherein said first lead, said first conductive post, said first electrical connector, said second lead are made of the same material.

7. The chip package structure of claim 2, wherein said lead frame further comprises a third lead around said carrier substrate, and said chip package structure further comprises:
   a) a second conductive post arranged on said third lead and being electrically coupled to said third lead, wherein said second conductive post is exposed on said first surface;
   b) a fourth lead arranged on said first surface and being electrically coupled with said second conductive post; and
   c) electrode pads arranged on said active face above said first surface and being electrically coupled to a second chip on said fourth lead via a second electrical connector, wherein said second plastic package further comprises said fourth lead and said second chip, said third lead is exposed on said second surface.

8. The chip package structure of claim 7, wherein electrode pads on said active face of said second chip are electrically coupled to said second lead via said second electrical connector.

9. The chip package structure of claim 8, wherein said second electrical connector comprises one of a conductive bump, a solder ball, and a metal wire.

10. A method of making a chip package structure, the method comprising:
    a) providing a lead frame having a carrier substrate and a first lead, and forming a first conductive post that is electrically coupled with said first lead on said first lead, wherein said first lead is around said carrier substrate;
    b) attaching an inactive surface of a first chip to said carrier substrate, and providing a first electrical connector on the electrode pads of an active face, wherein said inactive surface is opposite to said active face of said first chip;
    c) performing a first plastic process to form a first plastic package that fully encapsulates said first chip and partly encapsulates said lead frame, exposing said first conductive post and said first electrical connector on a first surface of said first plastic package, and exposing said first lead on a second surface that is opposite to said first surface; and
    d) forming a second lead that is configured to electrically couple said first conductive post to said first electrical connector on said first surface.

11. The method of claim 10, further comprising performing a second packaging process to fully encapsulate a second plastic package of said second lead.

12. The method of claim 11, further comprising forming said lead frame on a packaging substrate prior to forming a first conductive post that is electrically coupled with said first lead frame on said first lead.

13. The method of claim 12, wherein said forming said lead frame on said packaging substrate comprises:
    a) forming a first conductive layer on said packaging substrate; and
    b) patterning said first conductive layer to form said lead frame.

14. The method of claim 13, wherein said providing said lead frame comprises integrally forming said carrier substrate and one of said first leads to electrically couple said carrier substrate with said first lead.

15. The method of claim 13, further comprising removing said packaging substrate after said second packaging process such that said first lead and said carrier substrate are exposed on said second surface.

16. The method of claim 15, further comprising forming said first conductive post on said first lead by an electroplating process.

17. The method of claim 15, wherein said forming said second lead comprises:
 a) forming a second conductive layer on said first surface; and
 b) patterning said second conductive layer to form said second lead.

18. The method of claim 12, further comprising forming a metal layer or a conductive bump on said electrode pads of said active face of said first chip as said first electrical connector.

19. The method of claim 18, wherein said electrode pads are attached to said carrier substrate by solder or conductive glue.

20. The method of claim 12, wherein said forming said lead frame on said packaging substrate further comprises a third lead around said carrier substrate, and the method further comprises
 a) forming a second conductive post prior to attaching said active face of said first chip to said carrier substrate, and exposing said second conductive post on said first surface when forming said first plastic package;
 b) forming a fourth lead that is electrically coupled with said second conductive post on said first surface after forming said first plastic package;
 c) electrically coupling said electrode pads on said active face of a second chip to said fourth lead via a second electrical connector;
 d) encapsulating said fourth lead and said second chip by said second plastic package when forming said second plastic package; and
 e) exposing said third lead on said second surface when forming said first plastic package.

* * * * *